United States Patent [19]

Ohike et al.

[11] Patent Number: 5,095,266
[45] Date of Patent: Mar. 10, 1992

[54] CROSS-COIL TYPE INDICATING INSTRUMENT

[75] Inventors: Yukio Ohike; Tomohiro Sugiyama, both of Shimada, Japan

[73] Assignee: Yazaki Corporation, Tokyo, Japan

[21] Appl. No.: 687,751

[22] Filed: Apr. 19, 1991

[30] Foreign Application Priority Data

Apr. 23, 1990 [JP] Japan .................................. 2-42491[U]

[51] Int. Cl.⁵ .................................................. G01R 1/02
[52] U.S. Cl. ........................................ 324/146; 324/125
[58] Field of Search ............... 324/146, 151 A, 151 A, 324/125

[56] References Cited
U.S. PATENT DOCUMENTS 5,017,862  5/1991  Brooks ............................... 324/146

*Primary Examiner*—Walter E. Snow
*Attorney, Agent, or Firm*—Venable, Baetjer and Howard

[57] ABSTRACT

An indicating instrument having a cross coil comprising a pair of mutually perpendicular coils wound on a coil bobbin for passing therethrough current changing with changes in the quantity to be measured, a magnet rotor disposed inside the coil bobbin for rotating in the direction of a magnetic field which is the combination of the respective magnetic fields generated by the cross coil, and a pointer for indicating the measured quantity which is mounted on a rotary shaft rotatable together with the magnetic rotor. In order to prevent unneccessary vibration of the rotary shaft, the rotary shaft is acted on by a damping force of a viscous liquid. The viscous liquid is accommodated in a recess formed in the upper surface of the magnet rotor, and the damping action is performed in cooperation with a damping projection projecting downward from a part of the coil bobbin.

5 Claims, 2 Drawing Sheets

CROSS-COIL TYPE INDICATING INSTRUMENT

BACKGROUND OF THE INVENTION

The present invention relates to an indicating instrument of the cross-coil type and, more particularly, to a cross-coil type indicating instrument suitable for use in a vehicle such as an automobile to serve as an on-vehicle indicating instrument of various kinds, such as a speedometer, tachometer or boost meter.

Hitherto, a type of on-vehicle indicating instrument having a pair of coils for generating magnetic fields perpendicular to each other has often been employed. Electric current changing with changes in the quantity to be measured is passed through the coils, and a magnet rotor is rotated in the direction of a combination magnetic field which is the combination of the respective magnetic fields generated by the pair of coils. A pointer which rotates together with the magnet rotor indicates the measured quantity.

A conventional indicating instrument of this type has a coil bobbin on which coils are wound in such a manner as to be perpendicular to each other. A disk-shaped magnet rotor with S and N poles formed thereon is disposed inside the coils and the coil bobbin. The magnet rotor has a rotary shaft which is integrally mounted thereon and which extends through the center of the rotor.

The coil bobbin is divided, at a position substantially intermediate thereof, into two coil bobbin sections which are adjacent to each other longitudinally of the rotary shaft. A first coil bobbin section has a first bearing hole formed therein, and a first end portion of the rotary shaft which projects from the magnet rotor is rotatably supported by the first bearing hole for sustaining radial load. A second coil bobbin section has a second bearing hole formed therein, and a second end portion of the rotary shaft is rotatably supported by the second bearing hole for sustaining radial and thrust loads. A recess filled with silicone oil, serving as a viscous fluid for damping, is formed in the periphery of the second bearing hole, and the recess serves as an oil reservoir.

The conventional instrument further has a damping projection formed integrally with the magnet rotor at a lower position of the rotor. The damping projection is dipped in the silicone oil received in the oil reservoir. With the damping projection being dipped in the silicone oil, the following effect is provided: when the magnet rotor and the rotary shaft integral with the rotor rotate together, their rotation inevitably requires that the damping projection also rotate against the viscosity of the silicone oil. Therefore, the rotation of the magnet rotor and the rotary shaft is damped by the silicone oil and the damping projection, and this damping serves to prevent unnecessary vibration of the rotary shaft.

However, the above-described construction of the conventional indicating instrument entails the following problem. In said construction, the oil reservoir is formed in the periphery of the second bearing hole acing as a thrust bearing means for the rotary shaft, and the damping projection of the magnet rotor is dipped in the silicone oil in the oil reservoir. However, when the indicating instrument is installed in a vehicle, and is thus used in an environment in which the instrument can be subjected to vibration caused by vehicle running, there is a risk that the magnet rotor may be displaced in the thrust direction of the rotary shaft. Upon such displacement, the displacement of the magnet rotor causes a corresponding reduction in the surface area of that portion of the damping projection dipped in the silicone oil in the oil reservoir, thereby causing a reduction in the damping force acted on the damping projection by the silicone oil. In this way, the damping force, which is required in the very event of vibration, is diminished, ending in unstable damping. Thus, with the conventional instrument, it has been difficult to effectively restrain unnecessary oscillation of the pointer caused by vibration.

SUMMARY OF THE INVENTION

In view of the above-described point, an object of the present invention is to provide a cross-coil type indicating instrument having a damping structure capable of stably exerting damping force even when subjected to vibration.

In order to achieve said object, according to the present invention, there is provided a cross-coil type indicating instrument in which a cross coil comprises a pair of coils mutually perpendicularly wound on a coil bobbin, and in which two end portions of a rotary shaft projecting upward and downward from a magnet rotor disposed inside the cross coil are rotatably supported by two bearings formed in the coil bobbin, the magnet rotor being driven to rotate to a certain angular position in accordance with a combination magnetic field which is the combination of the respective magnetic fields generated by the coils upon the supply of certain electricity to the coils. The cross-coil type indicating instrument is characterized in that: a recess receiving a viscous liquid for damping is formed in the upper surface of the magnet rotor; and a damping projection projecting downward from a coil bobbin section is inserted into the recess and dipped in the viscous liquid.

In the above-specified construction, a recess receiving a viscous liquid for damping is formed in the upper surface of the magnet rotor, and a damping projection projecting downward from a part of the coil bobbin is inserted into the recess and dipped in the viscous liquid. This arrangement provides the following effect when the indicating instrument is installed in a vehicle, and is thus used in an environment in which the instrument can be subjected to vibration generated by vehicle running. In the event that the magnet rotor is displaced by such vibration in the thrust direction the rotary shaft, an increase corresponding to this displacement occurs in the surface area of that portion of the damping projection dipped in the viscous liquid for damping, thereby increasing the damping force which is exerted by the damping projection on the viscous liquid. In this way, the damping force is increased in the very event of vibration, that is, exactly when the damping force is needed. Therefore, it is possible to provide stable damping actions and, hence, to effectively restrain oscillation of the pointer caused by vibration.

DESCRIPTION OF THE PREFERRED EMBODIMENT

An embodiment of the present invention will now be described with reference to the drawings.

Figure 1:
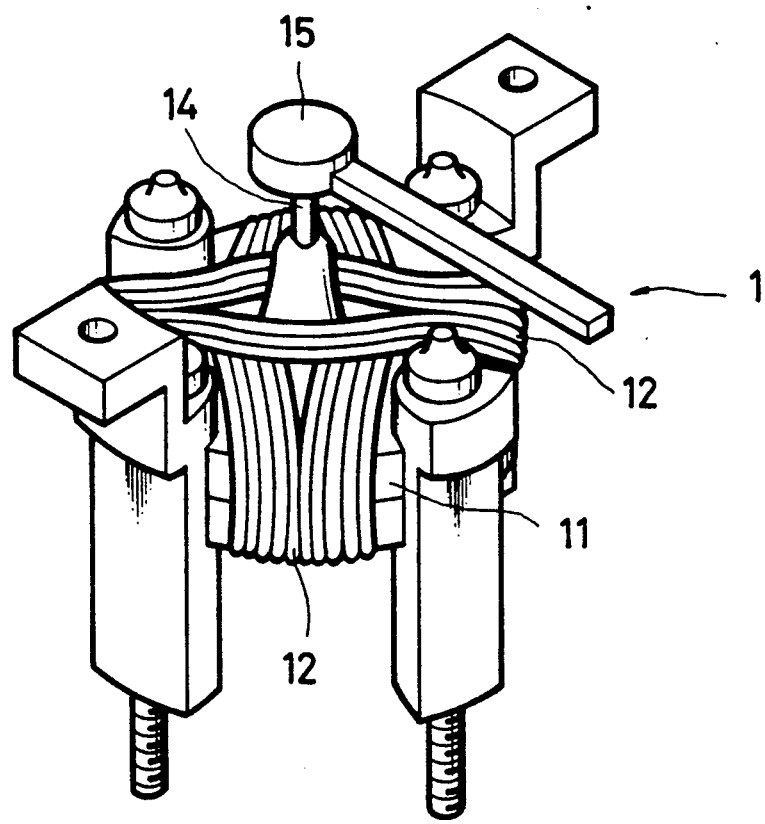
FIG. 1 is a perspective view of a movement of a cross-coil type indicating instrument according to the present invention, showing the external appearance of the movement.

Referring to FIG. 1, a movement 1 of a cross-coil type indicating instrument has a coil bobbin 11 on which a pair of coils 12 are wound mutually perpendicularly. A disk-shaped magnet rotor 13 with S and N poles formed thereon is disposed inside the coils 12 and the coil bobbin 11. The magnet rotor 13 has a rotary shaft 14 which is integrally mounted thereon and which extends through the center of the rotor 13. The rotary shaft 14 is rotatably supported by the coil bobbin 11. A first end of the shaft 14 projects from the coil bobbin 11, with a pointer 15 being secured to this projecting end of the rotary shaft 14.

The coil bobbin 11 is divided, at a position substantially intermediate thereof, into two coil bobbin sections 11a and 11b which are adjacent to each other longitudinally of the rotary shaft 14. The two coil bobbin sections 11a and 11b abut on each other to define a space 11c in which the magnet rotor 13 is disposed. A first coil bobbin section 11a has a first bearing hole 11a₁ formed therein, and a first end portion of the rotary shaft 14 which projects from the magnet rotor 13 is rotatably supported by the first bearing hole 11a₁ for sustaining radial load. A second coil bobbin section 11b has a second bearing hole 11b₁ formed therein, and a second end portion of the rotary shaft 14 is rotatably supported by the second bearing hole 11b₁ for sustaining radial and thrust loads.

Figure 2:
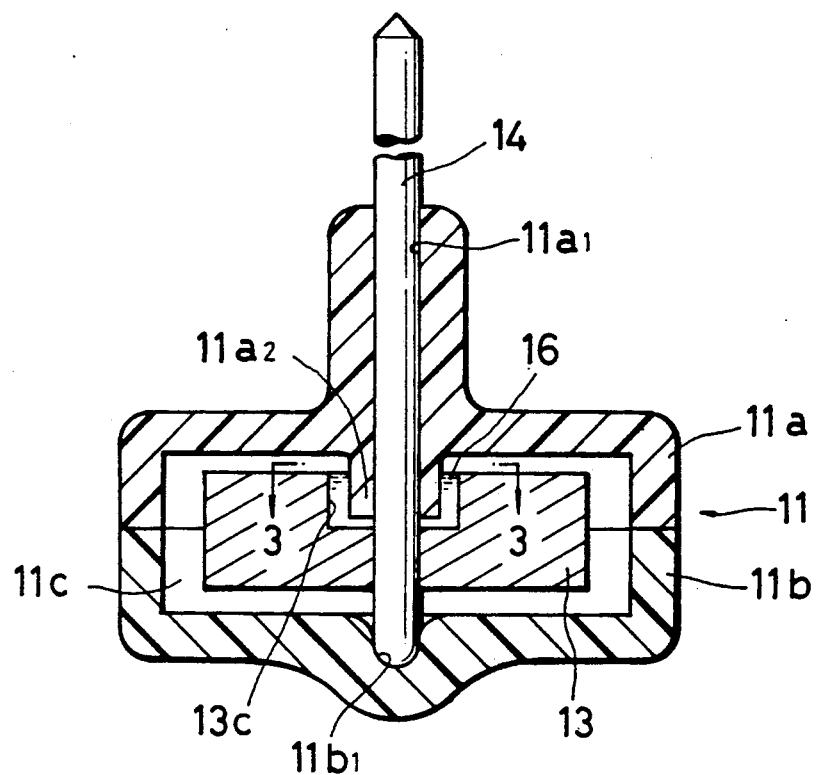
FIG. 2 is a vertical sectional view of the essential parts of the cross-coil type indicating instrument shown in FIG. 1.

Referring to FIG. 2, an oil reservoir 13c, consisting of a recess for receiving silicone oil 16 serving as a viscous liquid for damping, is formed on the upper surface of the magnet rotor 13, through which surface the first end portion of the rotary shaft 14 projects from the magnet rotor 13 into the first bearing hole 11a₁ of the first coil bobbin section 11a of the coil bobbin 11 to have its radial load sustained by the bearing hole 11a₁. A damping projection 11a₂, in the form of a cylindrical body projecting from the periphery of the first bearing hole 11a₁ of the first coil bobbin section 11a, is inserted into the oil reservoir 13c, and is dipped in the silicone oil 16 received in the reservoir 13c.

Figure 3:
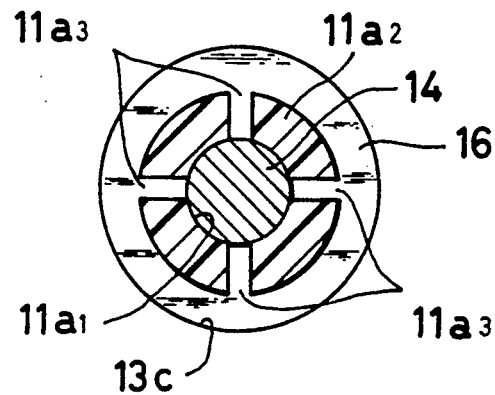
FIG. 3 is an enlarged sectional view taken along the line III—III shown in FIG. 2.

As shown in a cross-sectional view in FIG. 3, the cylindrical damping projection 11a₂ has slits 11a₃ formed therein, the slits 11a₃ radially extending from the first bearing hole 11a₁ while being spaced from each other at an equal interval of 90°. Consequently, the damping projection 11a₂ has a surface area which is thus increased, and a part of the silicone oil 16 received in the oil reservoir 13c enters the slits 11a₃. With a part of the silicone oil 16 in the oil reservoir 13c entering the slits 11a₃ of the damping projection 11a₂ formed on the coil bobbin section 11a, the rotation of the silicone oil 16 in the oil reservoir 13c caused by the rotation of the magnet rotor 13 can be restricted, and this restriction in turn damps the rotation of the magnet rotor 13.

In the above-described construction, the magnet rotor 13 is freely rotatable about the axis of the rotary shaft 14 when no electricity is supplied to the coils 12, whereas when certain electricity is supplied to the coils 12, the magnet rotor 13 is driven to rotate through a certain angle.

Although not shown, a hair spring is secured at a position above the rotary shaft 14, with one end of the spring being fixed to the coil bobbin 11. The hair spring urges the rotary shaft 14 in such a manner that the rotary shaft 14 returns to a predetermined zero position thereof when no electricity is supplied to the coils 12 and, accordingly, the magnet rotor 13 is freely rotatable.

When certain current is supplied, as a drive signal, to each of the coils 12, the magnet rotor 13 is rotated, in accordance with a combination magnetic field which is the combination of the respective magnetic fields generated by the coils 12, through a certain angle corresponding to the quantity to be measured. This rotation of the magnet rotor 13 causes the rotary shaft 14, integral with the rotor 13, to rotate, whereby the pointer 15 is oscillated over a character plate, not shown to indicate the measured quantity.

When the indicating instrument is installed in a vehicle, the indicating instrument is used in an environment involving the risk of the instrument being subjected to vibration caused by the running of the vehicle. In such cases, upon displacement of the magnet rotor 13 in the thrust direction of the rotary shaft 14, an increase corresponding to this displacement occurs in the surface area of that portion of the damping projection 11a₂ dipped in the silicone oil 16 received in the oil reservoir 13c. This increase causes an increase in the damping force which the damping projection 11a₂ exerts on the silicone oil 16. Thus, the damping force is increased exactly when vibration takes place and, accordingly, the application of damping force is needed, thereby making it possible to effect a stable damping action and, hence, to effectively restrain oscillation of the pointer caused by vibration.

In brief, according to the present invention, when the indicating instrument is installed in a vehicle, and is thus used in an environment in which the instrument can be subjected to vibration caused by vehicle running, in the event that the magnet rotor is displaced in the thrust direction of the rotary shaft by such vibration, the surface area of that portion of the damping projection dipped in the viscous liquid for damping received in the recess increases by an amount corresponding to the displacement of the magnet rotor so that the damping force exerted by the damping projection on the viscous liquid increases. Because the damping force is increased in the very event of vibration, that is, exactly when damping force is needed, stable damping actions can be performed and oscillation of the pointer can be effectively restrained.

What is claimed is:

1. A cross-coil type indicating instrument comprising:
   a cross coil comprising a pair of coils mutually perpendicularly wound on a coil bobbin for generating a combination magnetic field upon the supply of current in proportion to a given measurement quantity;
   a magnet rotor disposed inside said cross coil, said magnet rotor having a rotary shaft extending through the center of said magnet rotor and projecting upward and downward therefrom for the rotation of said magnet rotor through a certain angle in accordance with said combination magnetic field generated by said cross coil;
   two bearings formed in said coil bobbin for rotatably supporting upper and lower end portions of said rotary shaft;

a recess formed in the upper surface of said magnet rotor for receiving a viscous liquid for damping; and a damping projection formed projecting downward from a part of said coil bobbin, said damping projection being inserted into said recess and dipped in said viscous liquid.

2. A cross-coil type indicating instrument according to claim 1, wherein said damping projection is a cylindrical body projecting from the periphery of one of said bearings of said coil bobbin that rotatably supports said upper end portion of said rotary shaft.

3. A cross-coil type indicating instrument according to claim 2, wherein said damping projection has slits radially extending from the associated bearing.

4. A cross-coil type indicating instrument comprising:

a coil bobbin comprising two sections and defining therein a space;

a cross coil comprising a pair of coils mutually perpendicularly wound on said coil bobbin for generating a combination magnetic field upon the supply of current in proportion to a given measurement quantity;

a magnet rotor disposed in said space of said coil bobbin, said magnet rotor having a rotary shaft extending through the center of said magnet rotor and projecting upward and downward therefrom for the rotation of said magnet rotor through a certain angle in accordance with said combination magnetic field generated by said cross coil;

a first bearing hole formed in a first section among said two sections of said coil bobbin for rotatably supporting a first end portion of said rotary shaft while sustaining radial load thereof, and a second bearing hole formed in the second section of said coil bobbin for rotatably supporting a second end portion of said rotary shaft while sustaining radial and thrust loads thereof;

a recess formed in an upper surface of said magnet rotor in the periphery of said first bearing hole for receiving a viscous liquid for damping; and a damping projection formed as a cylindrical body projecting downward from the periphery of said first bearing hole formed in said first section of said coil bobbin, said damping projection being inserted into said recess and dipped in said viscous liquid.

5. A cross-coil type indicating instrument according to claim 4, wherein said damping projection has slits radially extending from said first bearing hole.

* * * * *